(12) United States Patent
Lee et al.

(10) Patent No.: US 9,000,291 B2
(45) Date of Patent: Apr. 7, 2015

(54) SOLAR CELL AND METHOD FOR MANUFACTURING THE SAME

(75) Inventors: Jinhyung Lee, Seoul (KR); Junyong Ahn, Seoul (KR); Younghyun Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 361 days.

(21) Appl. No.: 12/870,242

(22) Filed: Aug. 27, 2010

(65) Prior Publication Data

US 2010/0319770 A1 Dec. 23, 2010

(30) Foreign Application Priority Data

Nov. 3, 2009 (KR) .................. 10-2009-0105511

(51) Int. Cl.
*H01L 31/0224* (2006.01)
*H01L 31/068* (2012.01)

(52) U.S. Cl.
CPC ...... *H01L 31/022425* (2013.01); *H01L 31/068* (2013.01); *Y02E 10/52* (2013.01); *H01L 31/022433* (2013.01); *Y02E 10/547* (2013.01)

(58) Field of Classification Search
CPC ................. H01L 31/022425; H01L 31/0224; H01L 31/18; H01L 31/022433; Y02E 10/50
USPC ............................................... 136/261, 256
See application file for complete search history.

(56) References Cited

U.S. PATENT DOCUMENTS

2007/0209697 A1 9/2007 Karakida et al.

FOREIGN PATENT DOCUMENTS

| JP | 2000-164903 A | | 6/2000 |
|---|---|---|---|
| JP | 2005-101426 A | | 4/2005 |
| JP | 2005101426 A | * | 4/2005 |
| JP | 2008-135655 A | | 6/2008 |
| JP | 2009-16713 A | | 1/2009 |
| WO | WO 2009/128679 A2 | | 10/2009 |
| WO | WO 2010/101387 A2 | | 9/2010 |

OTHER PUBLICATIONS

Neuhaus et al., Industrial Silicon Wafer Solar Cells, Sep. 2007, Hindawi Publishing Corporation, Advances in OptoElectronics: vol. 2007, p. 1-15.*

* cited by examiner

*Primary Examiner* — James Lin
*Assistant Examiner* — Dujuan Horton
(74) *Attorney, Agent, or Firm* — Birch, Stewart, Kolasch & Birch, LLP

(57) ABSTRACT

A solar cell and a method for manufacturing the same are disclosed. The solar cell includes a first conductive type substrate, an emitter layer of a second conductive type opposite the first conductive type, the emitter layer and the substrate forming a p-n junction, a plurality of first electrodes electrically connected to the emitter layer, at least one current collector connected to the plurality of first electrodes, and a second electrode electrically connected to the substrate. Each of the plurality of first electrodes includes a first electrode layer and a second electrode layer on the first electrode layer. The at least one current collector includes a plurality of first current collector layers having a plurality of first portions and at least one second current collector layer on the plurality of first current collector layers.

21 Claims, 8 Drawing Sheets

SOLAR CELL AND METHOD FOR MANUFACTURING THE SAME

This application claims priority to and the benefit of Korean Patent Application No. 10-2009-0105511 filed in the Korean Intellectual Property Office on Nov. 3, 2009, the entire contents of which are incorporated herein by reference.

BACKGROUND OF THE INVENTION

1. Field of the Invention

Embodiments of the invention relate to a solar cell and a method for manufacturing the same.

2. Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes a substrate and an emitter layer, each of which is formed of a semiconductor, and electrodes respectively formed on the substrate and the emitter layer. The semiconductors forming the substrate and the emitter layer have different conductive types, such as a p-type and an n-type. A p-n junction is formed at an interface between the substrate and the emitter layer.

When light is incident on the solar cell, a plurality of electron-hole pairs are generated in the semiconductors. The electron-hole pairs are separated into electrons and holes by the photovoltaic effect. Thus, the separated electrons move to the n-type semiconductor (e.g., the emitter layer) and the separated holes move to the p-type semiconductor (e.g., the substrate), and then the electrons and holes are collected by the electrodes electrically connected to the emitter layer and the substrate, respectively. The electrodes are connected to each other using electric wires to thereby obtain electric power.

SUMMARY OF THE INVENTION

Embodiments of the invention provide a solar cell and a method for manufacturing the same capable of reducing a defective amount of the solar cell.

Embodiments of the invention also provide a solar cell and a method for manufacturing the same capable of improving the efficiency of the solar cell.

In one aspect, there is a solar cell including a first conductive type substrate, an emitter layer of a second conductive type opposite the first conductive type, the emitter layer and the substrate forming a p-n junction, a plurality of first electrodes electrically connected to the emitter layer, at least one current collector connected to the plurality of first electrodes, and a second electrode electrically connected to the substrate, wherein each of the plurality of first electrodes includes a first electrode layer and a second electrode layer positioned on the first electrode layer, and the at least one current collector includes a plurality of first current collector layers having a plurality of first portions and at least one second current collector layer positioned on the plurality of first current collector layers.

A width ratio of each of the plurality of first electrodes to the at least one current collector may be approximately 1:200 to 1:370.

A width of the first electrode layer may be approximately 50% to 150% of a width of the second electrode layer excluding the first electrode layer from the first electrode. The first electrode layer may have a width of approximately 30 μm to 80 μm. Each of the first electrode layer and the first portion may have a height of approximately 7 μm to 10 μm.

Each of the plurality of first portions may have a width of approximately 30 μm to 200 μm. Each of the first electrode layer and the first portion may have a height of approximately 7 μm to 10 μm.

The plurality of first portions may extend in a direction crossing the plurality of first electrode layers. The plurality of first portions may extend substantially parallel to one another. The plurality of first portions may be positioned on the same level layer as the plurality of first electrode layers.

A distance between two adjacent ones of the plurality of first portions may be approximately 20 μm to 100 μm.

The at least one second current collector layer may be positioned between adjacent ones of the plurality of first portions, on upper parts of the plurality of first portions, and on lateral surfaces of the plurality of first portions positioned at edges of the at least one first current collector layer.

The at least one second current collector layer may be positioned on upper parts and lateral surfaces of the plurality of first portions.

The at least one first current collector layer may further include at least one second portion for connecting the plurality of first portions to one another. The at least one second portion may extend in a direction crossing the plurality of first portions. The at least one second portion may be positioned on the same level layer as the plurality of first portions. The plurality of first portions may be positioned on the same level layer as the first electrode layers.

The at least one second current collector layer may be positioned between adjacent ones of the plurality of first portions, on upper parts of the plurality of first portions, on an upper part of the at least one second portion, on lateral surfaces of the plurality of first portions positioned at edges of the at least one first current collector layer, and on a lateral surface of the at least one second portion.

The at least one second current collector layer may be positioned on upper parts of the plurality of first portions, an upper part of the at least one second portion, lateral surfaces of the plurality of first portions, and a lateral surface of the at least one second portion.

The second electrode layer may be connected to the at least one second current collector layer.

In another aspect, there is a solar cell including a first conductive type substrate, an emitter layer of a second conductive type opposite the first conductive type, the emitter layer and the substrate forming a p-n junction, a plurality of first electrodes electrically connected to the emitter layer, at least one current collector connected to the plurality of first electrodes, and a second electrode electrically connected to the substrate, wherein a width ratio of each of the plurality of first electrodes to the at least one current collector is approximately 1:200 to 1:370.

The plurality of first electrodes may extend substantially parallel to one another. The at least one current collector may extend in a direction crossing the plurality of first electrodes. The plurality of first electrodes and the at least one current collector are positioned on the same level layer.

In another aspect, there is a method for manufacturing a solar cell including forming an emitter layer on a substrate, the emitter layer and the substrate forming a p-n junction, forming an anti-reflection layer on the emitter layer, forming a front electrode part pattern having a front electrode layer pattern and a first portion pattern on the anti-reflection layer, forming a plurality of front electrode layers connected to the emitter layer using the front electrode layer pattern, a plurality of first portions connected to the emitter layer using the first portion pattern, and a back electrode connected to the substrate, and forming a conductive layer on the plurality of front electrode layers and the plurality of first portions to respectively form a plurality of front electrodes and at least one front electrode current collector, the at least one front electrode current collector being connected to the plurality of front electrodes.

The forming of the plurality of front electrode layers, the plurality of first portions, and the back electrode may further include forming a back electrode pattern on a back surface of the substrate.

The forming of the plurality of front electrode layers, the plurality of first portions, and the back electrode further includes performing a thermal process on the substrate having the front electrode part pattern and the back electrode pattern to form the plurality of front electrode layers connected to the emitter layer, the plurality of first portions connected to the emitter layer, and the back electrode connected to the substrate.

The forming of the conductive layer may include forming the conductive layer on upper parts of the plurality of front electrode layers, upper parts of the plurality of first portions, lateral surfaces of the plurality of front electrode layers, and lateral surfaces of the plurality of first portions.

The forming of the conductive layer may include forming the conductive layer on upper parts of the plurality of front electrode layers, on upper parts of the plurality of first portions, between adjacent ones of the plurality of first portions, on lateral surfaces of the plurality of first portions positioned at edges of the at least one front electrode current collector, and on lateral surfaces of the plurality of front electrode layers.

The front electrode part pattern may further include a second portion pattern. When the thermal process is performed on the substrate, at least one second portion is formed using the second portion pattern, the at least one second portion being connected to the emitter layer and connecting the plurality of first portions to one another.

The forming of the at least one front electrode current collector may include forming the conductive layer on an upper part and a lateral surface of the at least one second portion.

The front electrode part pattern and the back electrode pattern may be formed using a screen printing method.

The conductive layer may be formed using a plating method. The plating method may be an electroplating method or a light induced plating (LIP) method.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
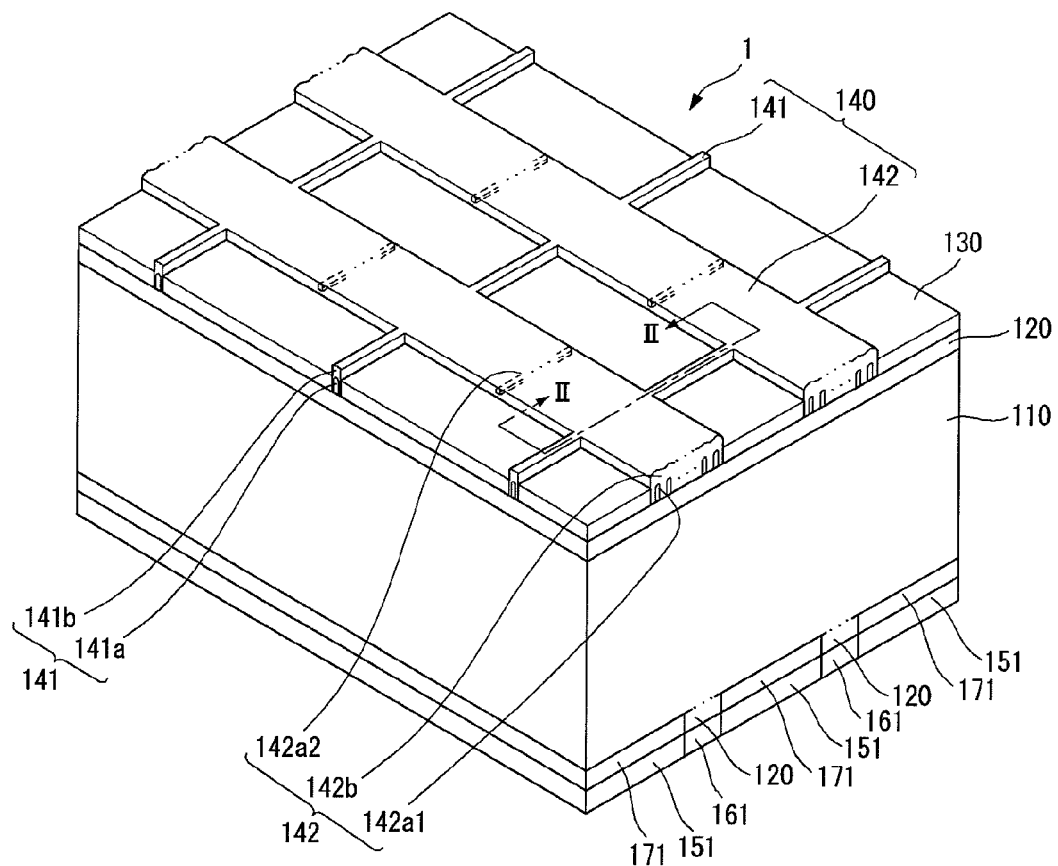
FIG. 1 is a partial perspective view of a solar cell according to an embodiment of the invention.

The invention will be described more fully hereinafter with reference to the accompanying drawings, in which example embodiments of the inventions are shown. This invention may, however, be embodied in many different forms and should not be construed as limited to the embodiments set forth herein.

In the drawings, the thickness, the height, etc., of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Reference will now be made in detail to embodiments of the invention, examples of which are illustrated in the accompanying drawings.

Figure 2:
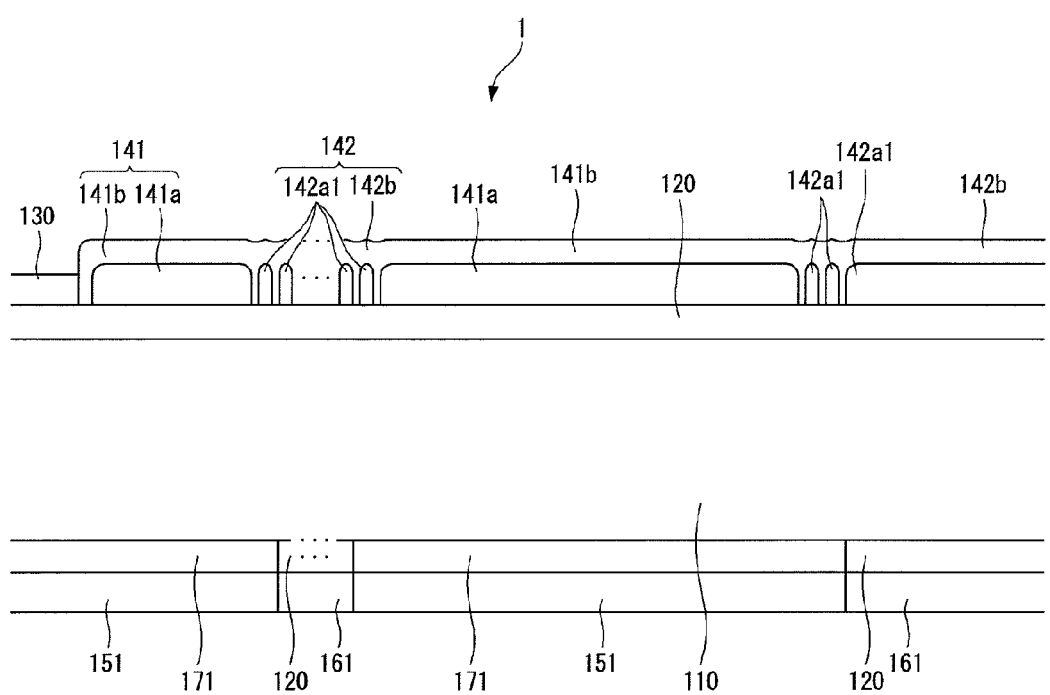
FIG. 2 is a cross-sectional view taken along line II-II of FIG. 1.
Figure 3:
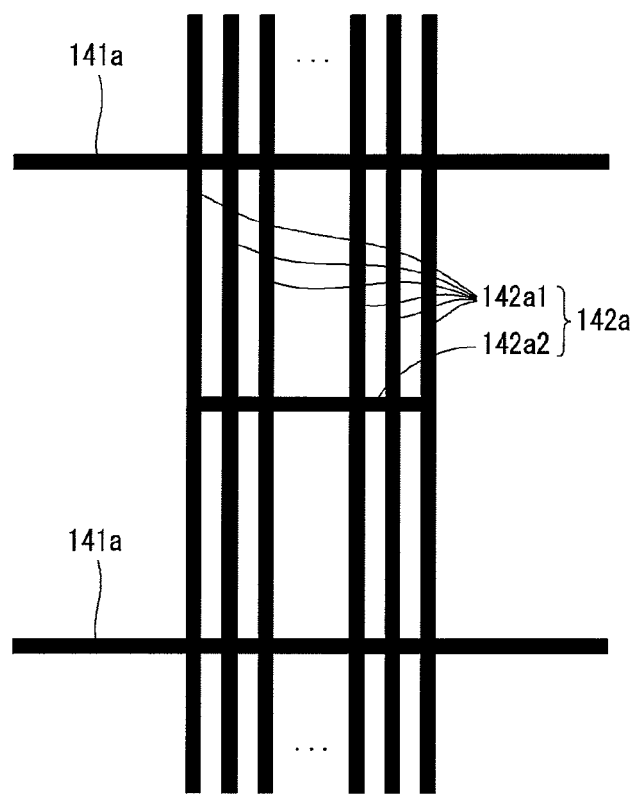
FIG. 3 partially illustrates a first front electrode layer and a first current collector layer of a front electrode part.

FIG. 1 is a partial perspective view of a solar cell according to an embodiment of the invention. FIG. 2 is a cross-sectional view taken along line II-II of FIG. 1. FIG. 3 partially illustrates a first front electrode layer and a first current collector layer of a front electrode part.

As shown in FIGS. 1 and 2, a solar cell 1 according to an embodiment of the invention includes a substrate 110, an emitter layer 120 positioned in the substrate 110, an anti-reflection layer 130 on the emitter layer 120 positioned at a surface (hereinafter, referred to as "a front surface") of the substrate 110 on which light is incident, a front electrode part 140 positioned on the emitter layer 120 of the front surface of the substrate 110, a back electrode 151 positioned on a surface (hereinafter, referred to as "a back surface"), opposite the front surface of the substrate 110, on which light is not incident, a back electrode current collector 161 that is positioned on the back surface of the substrate 110 and is electrically connected to the back electrode 151, and a back surface field layer 171 positioned between the substrate 110 and the back electrode 151.

The substrate 110 is a semiconductor substrate formed of first conductive type silicon, for example, p-type silicon, though not required. Silicon used in the substrate 110 may be crystalline silicon such as single crystal silicon and polycrystalline silicon or amorphous silicon. When the substrate 110 is of a p-type, the substrate 110 may contain impurities of a group III element such as boron (B), gallium (Ga), and indium (In). Alternatively, the substrate 110 may be of an n-type, and/or be formed of materials other than silicon. When the substrate 110 is of the n-type, the substrate 110 may contain impurities of a group V element such as phosphor (P), arsenic (As), and antimony (Sb).

The surface of the substrate 110 may be textured to form a textured surface corresponding to an uneven surface or having uneven characteristics. In this instance, an amount of light incident on the substrate 110 increases because of the textured surface of the substrate 110, and thus the efficiency of the solar cell 1 is improved.

The emitter layer 120 formed in the substrate 110 is an impurity region of a second conductive type (for example, an n-type) opposite the first conductive type (for example, a p-type) of the substrate 110, and thus forms a p-n junction along with the substrate 110.

A plurality of electron-hole pairs produced by light incident on the substrate 110 is separated into electrons and holes by a built-in potential difference resulting from the p-n junction. Then, the separated electrons move to the n-type semiconductor, and the separated holes move to the p-type semiconductor. Thus, when the substrate 110 is of the p-type and the emitter layer 120 is of the n-type, the separated holes and the separated electrons move to the substrate 110 and the emitter layer 120, respectively. Accordingly, the holes become major carriers in the substrate 110, and the electrons become major carriers in the emitter layer 120.

Because the substrate 110 and the emitter layer 120 form the p-n junction, the emitter layer 120 may be of the p-type when the substrate 110 is of the n-type unlike the embodiment described above. In this instance, the separated electrons and the separated holes move to the substrate 110 and the emitter layer 120, respectively.

Returning to the embodiment of the invention, when the emitter layer 120 is of the n-type, the emitter layer 120 may be formed by doping the substrate 110 with impurities of a group V element such as P, As, and Sb. On the contrary, when the emitter layer 120 is of the p-type, the emitter layer 120 may be formed by doping the substrate 110 with impurities of a group III element such as B, Ga, and In.

The anti-reflection layer 130 on the emitter layer 120 is formed of silicon nitride (SiNx) and/or silicon oxide ($SiO_x$). The anti-reflection layer 130 reduces a reflectance of light incident on the solar cell 1 and increases selectivity of a predetermined wavelength band, thereby increasing the efficiency of the solar cell 1. The anti-reflection layer 130 may have a singe-layered structure or a multi-layered structure such as a double-layered structure. The anti-reflection layer 130 may be omitted, if desired.

As shown in FIGS. 1 and 2, the front electrode part 140 includes a plurality of front electrodes 141 and a plurality of front electrode current collectors 142.

The plurality of front electrodes 141 are electrically and physically connected to the emitter layer 120 and extend substantially parallel to one another in a fixed direction. Each of the front electrodes 141 has a width of approximately 50 μm to 100 μm and a height of approximately 9 μm to 17 μm. Each of the front electrodes 141 includes a first front electrode layer 141a and a second front electrode layer 141b positioned on the first front electrode layer 141a.

In the embodiment of the invention, when the first front electrode layer 141a is printed using a screen printing method, the first front electrode layer 141a has a width of approximately 60 μm to 80 μm. When the first front electrode layer 141a is printed using a direct printing method such as an inkjet printing method, the first front electrode layer 141a has a width of approximately 30 μm to 80 μm. A minimum width of a pattern formed using the screen printing method is greater than a minimum width of a pattern formed using the direct printing method because of process properties of the screen printing method. Thus, the width of the first front electrode layer 141a may vary depending of the printing method used.

Further, the first front electrode layer 141a has a height of approximately 7 μm to 10 μm.

When each of the width and the height of the first front electrode layer 141a is less than its minimum value, the front electrode 141 does not operate normally. Further, when each of the width and the height of the first front electrode layer 141a is greater than its maximum value, an incident area of light decreases and a formation material of the front electrode 141 is unnecessarily wasted because the width and the height of the front electrode 141 unnecessarily increase.

The second front electrode layer 141b is formed on the first front electrode layer 141a using a plating method.

The width of the first front electrode layer 141a may be approximately 50% to 150% of a width of the second front electrode layer 141b excluding the first front electrode layer 141a from the front electrode 141. For example, when the width of the second front electrode layer 141b is approximately 30 μm, the width of the first front electrode layer 141a underlying the second front electrode layer 141b may be approximately 15 μm to 45 μm. As described above, the width of the second front electrode layer 141b is a width excluding the first front electrode layer 141a from the front electrode 141.

The front electrodes 141 collect carriers (e.g., electrons) moving to the emitter layer 120. The front electrode current collectors 142 are positioned on the emitter layer 120 and extend substantially parallel to one another in a direction crossing an extending direction of the front electrodes 141. The front electrode current collectors 142 are electrically and physically connected to the emitter layer 120 and the front electrodes 141.

Each of the front electrode current collectors 142 has a width of approximately 1.5 mm and includes a first current collector layer 142a and a second current collector layer 142b positioned on the first current collector layer 142a.

As shown in FIG. 3, the first current collector layer 142a has a plurality of first portions 142a1 that extend substantially parallel to one another in a direction crossing an extending direction of the first front electrode layers 141a and a plurality of second portions 142a2 that extend substantially parallel to one another in the same direction as the extending direction of the first front electrode layers 141a.

The first portions 142a1 and the first front electrode layers 141a are placed on the same plane. The first portion 142a1 is electrically and physically connected to the corresponding first front electrode layer 141a at each of crossings of the first portions 142a1 and the first front electrode layers 141a.

A width and a height of each first portion 142a1 are substantially equal to a width and a height of each first front electrode layer 141a. The first and second portions 142a1 and 142a2 have a width of approximately 30 μm to 120 μm or approximately 60 μm to 200 μm and a height of approximately 7 μm to 10 μm. A distance between the two adjacent first portions 142a1 is approximately 20 μm to 100 μm. Other sizes may be used. As described above, various widths of the first and second portions 142a1 and 142a2 are obtained through various printing methods used to form the first and second portions 142a1 and 142a2.

When each of the width and the height of the first and second portions 142a1 and 142a2 is less than its minimum value, the front electrode current collector 142 does not operate normally. Further, when each of the width and the height of the first and second portions 142a1 and 142a2 is greater than its maximum value, an incident area of light decreases and a formation material of the front electrode current collector 142 is unnecessarily wasted because the width and the height of the front electrode current collector 142 unnecessarily increases.

As shown in FIG. 3, the second portions 142a2 extend parallel to one another in the same direction as the first front electrode layers 141a. As described above, the width and the height of the second portion 142a2 are substantially equal to the width and the height of the first portion 142a1. In this instance, an extending length of the second portion 142a2 does not exceed the width of the front electrode current collector 142.

The first portions 142a1 of each front electrode current collector 142 are electrically and physically connected to one another through the second portions 142a2. The number of second portions 142a2 in each front electrode current collector 142 may decrease or increase, if necessary. The second portions 142a2 of each front electrode current collector 142 are positioned except at a formation area of the first front electrode layer 141a.

The second current collector layer 142b is formed on the first and second portions 142a1 and 142a2 of the first current collector layer 142a through a plating method. The second current collector layer 142b is positioned between the adjacent first portions 142a1. In an embodiment of the invention, the second current collector layer 142b is positioned between the adjacent ones of the plurality of first portions 142a1, on upper parts of the plurality of first portions 142a1, and on lateral surfaces of the plurality of first portions 142a1 positioned at edges of the first current collector layer 142, on an upper part of the second portions 142a2, and/or on a lateral surface of the second portions 142a2. In an embodiment of the invention, the first portions 142a1, the second portions 142a2, or both, of the first current collector layer 142a, are respectively encapsulated on three sides by the second current collector layer 142b.

As shown in FIG. 2, a portion of the second current collector layer 142b is in contact with the emitter layer 120 at positions between the adjacent ones of the plurality of first portions 142a1. Accordingly, the plurality of first portions 142a1, the second portions 142a2, and portions of the second current collector layer 142b may all contact the emitter layer 120. Additionally, as shown in FIG. 1, a portion of the first front electrode layer 141a and a portion of the second front electrode layer 141b may all contact the emitter layer.

In the embodiment of the invention, because the second current collector layer 142b is positioned on the same level layer as the second front electrode layer 141b, the second front electrode layer 141b and the second current collector layer 142b are electrically and physically connected to each other at crossings of the first front electrode layer 141a and the first portions 142a1 of the first current collector layer 142a.

As described above, because each front electrode 141 includes one first front electrode layer 141a and each front electrode current collector 142 includes the plurality of first portions 141a, the width of each front electrode current collector 142 is much greater than the width of each front electrode 141. In the embodiment of the invention, a width ratio of each front electrode 141 and each front electrode current collector 142 is approximately 1:200 to 1:370.

For example, when the width of the first front electrode layer 141a is approximately 40 μm, the front electrode current collector 142 has a width of approximately 1.5 mm. A sheet resistance Rs of each front electrode current collector 142 is approximately 0.012 Ωcm$^2$, and a specific resistance of each front electrode current collector 142 is approximately 2.33 uΩcm.

The width of the first or second portion 142a1 or 142a2 may be approximately 50% to 150% of the width of the second current collector layer 142b excluding the first and second portions 142a1 and 142a2 from the front electrode current collector 142 in the same manner as a relationship between the first and second front electrode layers 141a and 141b.

Because the front electrode current collectors 142 are connected to the front electrodes 141, the front electrode current collectors 142 collect carriers transferred through the front electrodes 141 and output the carriers to the outside.

The front electrode part 140 contains a conductive material such as silver (Ag). Alternatively, the front electrode part 140 may contain at least one selected from the group consisting of nickel (Ni), copper (Cu), aluminum (Al), tin (Sn), zinc (Zn), indium (In), titanium (Ti), gold (Au), and a combination thereof. Other conductive materials may be used.

The anti-reflection layer 130 is positioned on the emitter layer 120, on which the front electrode part 140 is not positioned, because of the front electrode part 140 electrically and physically connected to the emitter layer 120.

The back electrode 151 on the back surface of the substrate 110 is positioned on almost the entire back surface of the substrate 110 excluding a formation portion of the back electrode current collector 161 from the back surface of the substrate 110. The back electrode 151 collects carriers (e.g., holes) moving to the substrate 110.

The back electrode 151 contains at least one conductive material such as Al. Alternatively, the back electrode 151 may contain at least one selected from the group consisting of Ni, Cu, Ag, Sn, Zn, In, Ti, Au, and a combination thereof. Other conductive materials may be used.

The back electrode current collector 161 is positioned on the substrate 110 and is opposite to the front electrode current collectors 142 with the substrate 110 interposed therebetween. The back electrode current collector 161 is electrically connected to the back electrode 151.

The back electrode current collector 161 collects carriers (for example, holes) transferred from the back electrode 151 and output the carriers to the outside.

Unlike FIGS. 1 and 2, the back electrode current collector 161 may partially overlap the back electrode 151 adjacent to the back electrode current collector 161. In this instance, a contact area between the back electrode 151 and the back electrode current collector 161 increases, and thus the conductivity of carriers is improved.

The back electrode current collector 161 contains at least one conductive material such as Ag. Alternatively, the back electrode current collector 161 may contain at least one selected from the group consisting of Ni, Cu, Al, Sn, Zn, In, Ti, Au, and a combination thereof. Other conductive materials may be used.

The back surface field layer 171 between the back electrode 151 and the substrate 110 is a region (for example, a p+-type region) that is more heavily doped with impurities of the same conductive type as the substrate 110 than the substrate 110. The movement of electrons to the back surface of the substrate 110 is prevented or reduced by a potential barrier resulting from a difference between impurity doping concentrations of the substrate 110 and the back surface field layer 171. Thus, a recombination and/or a disappearance of the electrons and the holes around the surface of the substrate 110 are prevented or reduced.

An operation of the solar cell 1 having the above-described structure is described below.

When light irradiated to the solar cell 1 is incident on the substrate 110 through the emitter layer 120, a plurality of electron-hole pairs are generated in the substrate 110 by light energy based on the incident light. In this instance, because a reflection loss of the light incident on the substrate 110 is reduced by the anti-reflection layer 130, an amount of light incident on the substrate 110 further increases.

The electron-hole pairs are separated into electrons and holes by the p-n junction of the substrate 110 and the emitter layer 120, and the separated electrons move to the n-type emitter layer 120 and the separated holes move to the p-type substrate 110. The electrons moving to the n-type emitter layer 120 are collected by the front electrodes 141 and then move to the front electrode current collectors 142 electrically connected to the front electrodes 141. The holes moving to the p-type substrate 110 are collected by the back electrode 151 through the back surface field layer 171 and then move to the back electrode current collector 161. When the front electrode current collectors 142 are connected to the back electrode current collector 161 using electric wires, current flows therein to thereby enable use of the current for electric power.

In the embodiment of the invention, the width ratio of each front electrode 141 and each front electrode current collector 142 is approximately 1:200 to 1:370. In other words, because the width of the front electrode 141 is much less than the width of the front electrode current collector 142, an incident area of light greatly increases. Hence, the efficiency of the solar cell 1 is improved. Further, a formation density of the front electrodes 141 may increase because of a reduction in the width of the front electrodes 141 without a reduction in the incident area of light, and thus a distance between carriers and the front electrodes 141 decreases. Hence, a loss of carriers decreases and the conductivity of carriers is improved. As a result, the efficiency of the solar cell 1 is further improved.

A method for manufacturing the solar cell 1 according to the embodiment of the invention is described below with reference to FIGS. 4A to 4F.

FIGS. 4A to 4F are cross-sectional views sequentially illustrating each of stages in a method of manufacturing a solar cell according to an embodiment of the invention.

Figure 4A:
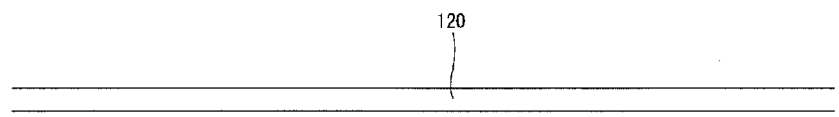
FIGS. 4A to 4F are cross-sectional views sequentially illustrating each of stages in a method of manufacturing a solar cell according to an embodiment of the invention.
Figure 4A:
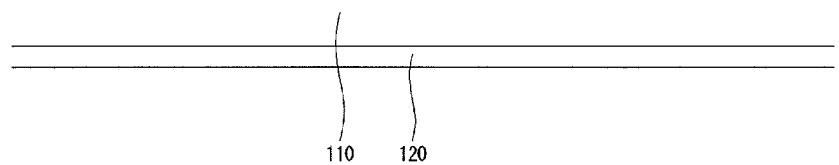

First, as shown in FIG. 4A, a high temperature thermal process of a material (for example, $POCl_3$ or $H_3PO_4$) containing impurities of a group V element such as P, As, and Sb is performed on the substrate 110 formed of p-type single crystal silicon or p-type polycrystalline silicon to distribute the group V element impurities on the substrate 110. Hence, the emitter layer 120 is formed in the entire surface of the substrate 110 including a front surface, a back surface, and lateral surfaces of the substrate 110. When the substrate 110 is of an n-type unlike the embodiment of the invention, a high temperature thermal process of a material (for example, $B_2H_6$) containing group III element impurities is performed on the substrate 110 or the material containing the group III element impurities is stacked on the substrate 110 to form the p-type emitter layer 120 on the entire surface of the substrate 110.

Subsequently, phosphorous silicate glass (PSG) containing phosphor (P) or boron silicate glass (BSG) containing boron (B) produced when p-type impurities or n-type impurities are distributed inside the substrate 110 is removed through an etching process.

If necessary, before the emitter layer 120 is formed, a texturing process may be performed on the entire surface of the substrate 110 to form a textured surface of the substrate 110. When the substrate 110 is formed of single crystal silicon, the texturing process may be performed using a basic solution such as KOH and NaOH. When the substrate 110 is formed of polycrystalline silicon, the texturing process may be performed using an acid solution such as HF and $HNO_3$.

Figure 4B:
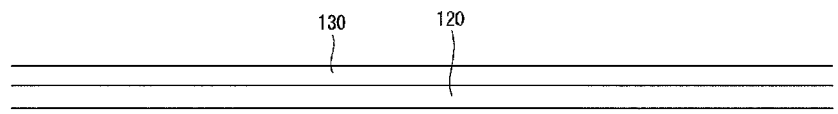
Figure 4B:
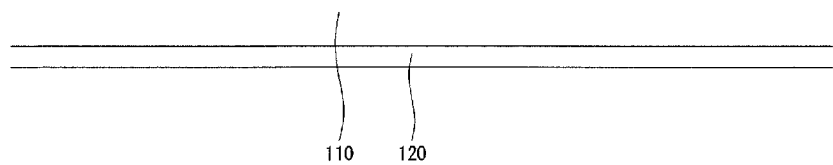

Next, as shown in FIG. 4B, the anti-reflection layer 130 is formed on the front surface of the substrate 110 using a chemical vapor deposition (CVD) method such as a plasma enhanced chemical vapor deposition (PECVD) method.

Figure 4C:
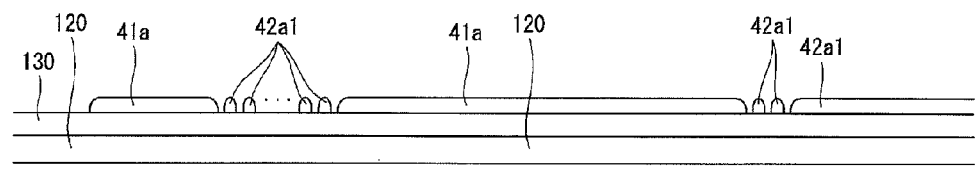
Figure 4C:
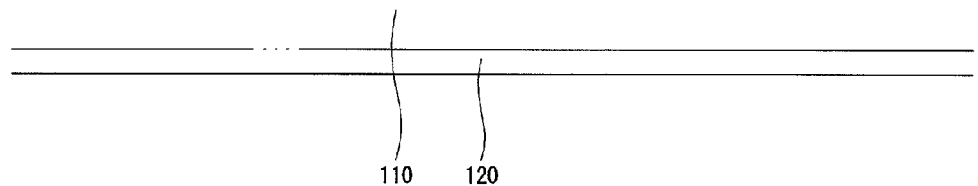

Next, as shown in FIG. 4C, a front electrode part paste containing Ag is coated on a desired portion of the anti-reflection layer 130 using a screen printing method and then is dried at about 170° C. to form a front electrode part pattern shown in FIG. 3. The front electrode part pattern includes a first front electrode layer pattern 41a and a first current collector layer pattern having a first portion pattern 42a1 and a second portion pattern. In this instance, a width of the first front electrode layer pattern 41a, a width of the first portion pattern 42a1, and a width of the second portion pattern are substantially equal to one another. Hence, there is scarcely a difference between a height of the first front electrode layer pattern 41a and a height of the first current collector layer pattern formed using the screen printing method.

The front electrode part paste may contain at least one selected from the group consisting of Ni, Cu, Al, Sn, Zn, In, Ti, Au, and a combination thereof, instead of Ag.

Figure 4D:
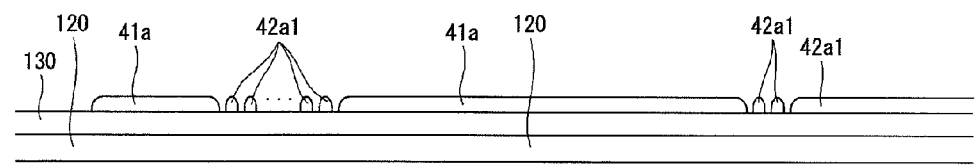
Figure 4D:
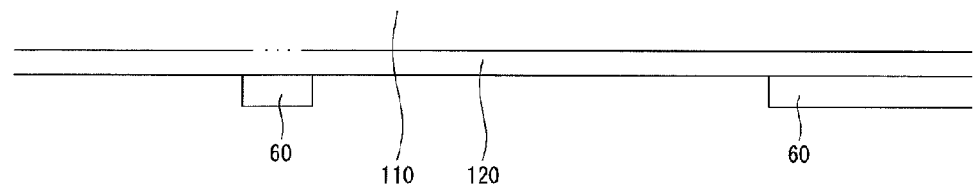

Next, as shown in FIG. 4D, a paste containing Ag is coated on a corresponding portion of the back surface of the substrate 110 to the first portion pattern 42a1 using the screen printing method and then is dried to form a back electrode current collector pattern 60.

Figure 4E:
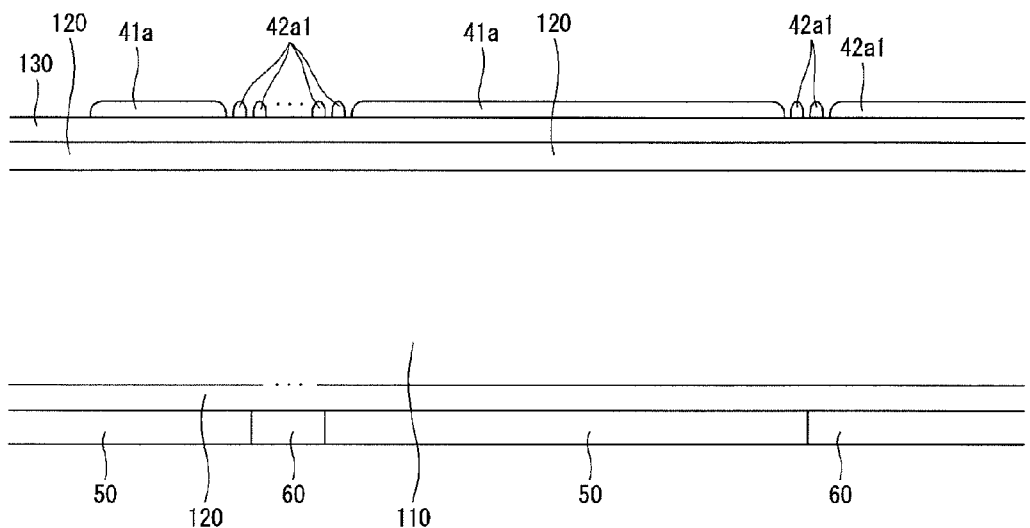

Next, as shown in FIG. 4E, a paste containing Al is coated on almost the entire back surface of the substrate 110 excluding a formation portion of the back electrode current collector pattern 60 on the back surface of the substrate 110 using the screen printing method and then is dried to form a back electrode pattern 50.

In the embodiment of the invention, a formation order of the first front electrode layer pattern 41a, the first current collector layer pattern, the back electrode current collector pattern 60, and the back electrode pattern 50 may vary.

Figure 4F:
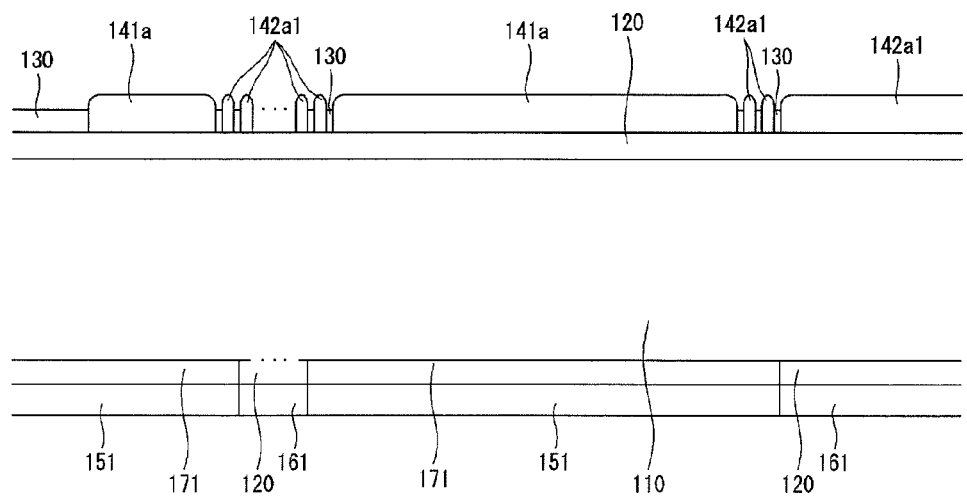

Next, as shown in FIG. 4F, a firing process is performed on the substrate 110 including the first front electrode layer pattern 41a, the first current collector layer pattern, the back electrode current collector pattern 60, and the back electrode pattern 50 at a temperature of about 750° C. to 800° C. to form the plurality of first front electrode layers 141a, the plurality of first current collector layers 142a having the first portions 142a1, the back electrode 151, the back electrode current collector 161, and the back surface field layer 171.

More specifically, when a thermal process is performed, the plurality of first front electrode layers 141a contacting the emitter layer 120 and the plurality of first current collector layers (i.e., the first and second portions 142a1, 142a2) contacting the emitter layer 120 are formed due to an element such as lead (Pb) contained in the front electrode part pattern including the first front electrode layer pattern 41a and the first current collector layer pattern. In this instance, the plurality of first front electrode layers 141a pass through a contact portion of the anti-reflection layer 130 between the first front electrode layer pattern 41a and the anti-reflection layer 130 to thereby contact the emitter layer 120, and the plurality of first current collector layers pass through a contact portion of the anti-reflection layer 130 between the first current collector layer pattern and the anti-reflection layer 130 to thereby contact the emitter layer 120. Further, the back electrode 151 electrically and physically connected to the substrate 110 and the back electrode current collector 161 electrically and physically connected to the back electrode 151 are formed on the back surface of the substrate 110. In this instance, metal components contained in each of the patterns 41a, 42a1, 60, and 50 chemically couples with the layers 120 and 110, and thus a contact resistance is reduced. Hence, a current flow is improved.

In the embodiment of the invention, the first front electrode layer 141a has a width of approximately 30 μm to 80 μm and a height of approximately 7 µm to 10 µm, and the first portion 142a1 has a width of approximately 30 µm to 120 µm and a height of approximately 7 µm to 10 µm. Further, a distance between the two adjacent first portions 142a1 is approximately 20 µm to 100 µm.

Further, during the thermal process, Al contained in the back electrode 151 is distributed on the substrate 110 contacting the back electrode 151 to form the back surface field layer 171 between the back electrode 151 and the substrate 110. The back surface field layer 171 is an impurity region doped with impurities of the same conductive type as the substrate 110, for example, p-type impurities. An impurity doping concentration of the back surface field layer 171 is greater than an impurity doping concentration of the substrate 110, and thus the back surface field layer 171 is a p+-type region. A portion of the emitter layer 120 exists under the electrode current collector 161.

Subsequently, the second front electrode layer 141b and the second current collector layer 142b are respectively formed on the first front electrode layer 141a and the first current collector layers 142a using the first front electrode layer 141a and the first current collector layer 142a on the front surface of the substrate 110 as a seed layer through a plating method such as an electroplating method and a light induced plating (LIP) method to thereby complete the front electrode part 140 including the plurality of front electrodes 141 and the plurality of front electrode current collectors 142. Next, an edge isolation process for removing the emitter layer 120 formed in edges of the substrate 110 is performed using a laser beam to electrically separate the emitter layer 120 on the front surface of the substrate 110 from the emitter layer 120 on the back surface of the substrate 110. Finally, the solar cell 1 shown in FIGS. 1 and 2 is completed.

As described above, because the first current collector layers 142a having the width substantially equal to the width of the first front electrode layers 141a are used as the seed layer used to form the front electrode current collectors 142, a defective amount of the solar cell 1 is reduced and the conductivity of carriers is improved.

More specifically, in a related art in which a first current collector layer of a front electrode current collector is configured by one conductive layer having a width substantially equal to a width of the front electrode current collector, a width of the first current collector layer is much greater than a width of a first front electrode layer. Thus, when the first front electrode layer and the first current collector layer are formed using the screen printing method, a width of a mesh used to form the first current collector layer is much greater than a width of a mesh used to form the first front electrode layer.

As the width of the mesh decreases, an amount of paste injected into the mesh generally decreases. Therefore, an amount of paste injected into the mesh used to form the first current collector layer is more than an amount of paste injected into the mesh used to form the first front electrode layer. Hence, the first current collector layer has a normal thickness that is substantially equal to a thickness of the mesh, but the first front electrode layer does not have a normal thickness. As a result, there is a great difference between the thicknesses of the first current collector layer and the first front electrode layer.

When a thermal process such as a drying process and a firing process is performed in a subsequent process of a paste coating process, a physical connection between the first front electrode layer and the first current collector layer is cut because of the thicknesses difference therebetween.

Further, in the firing process for connecting the first front electrode layer and the first current collector layer to an emitter layer, firing conditions (for example, an amount of material, for example, Pb passing through an anti-reflection layer) are determined based on the first front electrode layer, whose thickness is much less than the thickness of the first current collector layer, because of the thicknesses difference between the first front electrode layer and the first current collector layer. Thus, the connection problem between the first current collector layer passing through the emitter layer and the substrate is generated.

In addition, in the related art, it is difficult to obtain the first current collector layer having a desired width when a screen printing operation is once performed. Therefore, because the screen printing operation has to be performed several times, time and material are wasted.

On the other hand, in the embodiment of the invention, because the width of each of the first and second portions 142a1 and 142a2 of the first current collector layer 142a is substantially equal to the width of the first front electrode layer 141a, the height of each of the first and second portions 142a1 and 142a2 is substantially equal to the height of the first front electrode layer 141a. Hence, the problem of the thermal process resulting from a difference between the heights of the layers 141a, 142a1, and 142a2 is solved, and thus the conductivity of carriers is improved.

Further, because the printing operation is once performed to form the first portions 142a1 of the first current collector layers 142a, manufacturing time of the solar cell 1 is reduced. As a result, an amount of the paste used is greatly decreased, and the manufacturing cost of the solar cell 1 is reduced.

A solar cell 1a according to another embodiment of the invention is described below with reference to FIGS. 5 and 6. Structures and components identical or equivalent to those illustrated in FIGS. 1 and 2 are designated with the same reference numerals, and a further description may be briefly made or may be entirely omitted.

Figure 5:
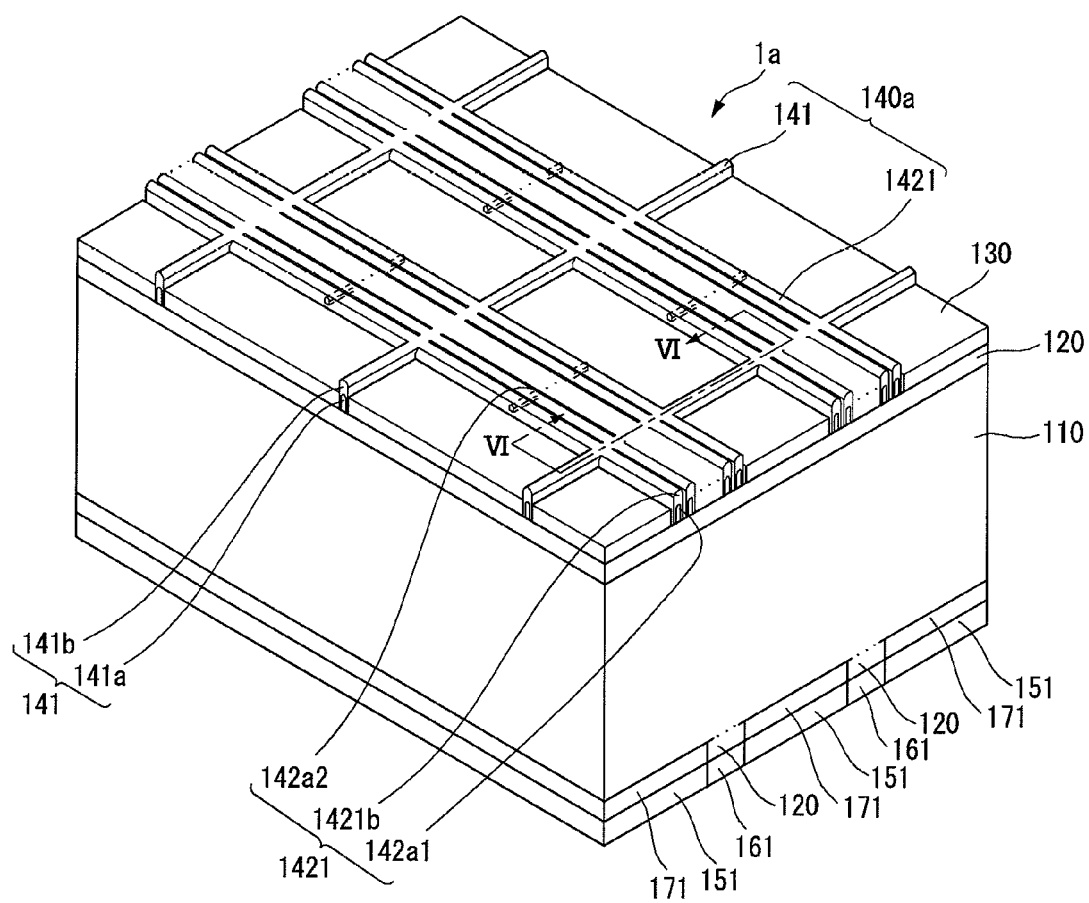
FIG. 5 is a partial perspective view of a solar cell according to another embodiment of the invention.
Figure 6:
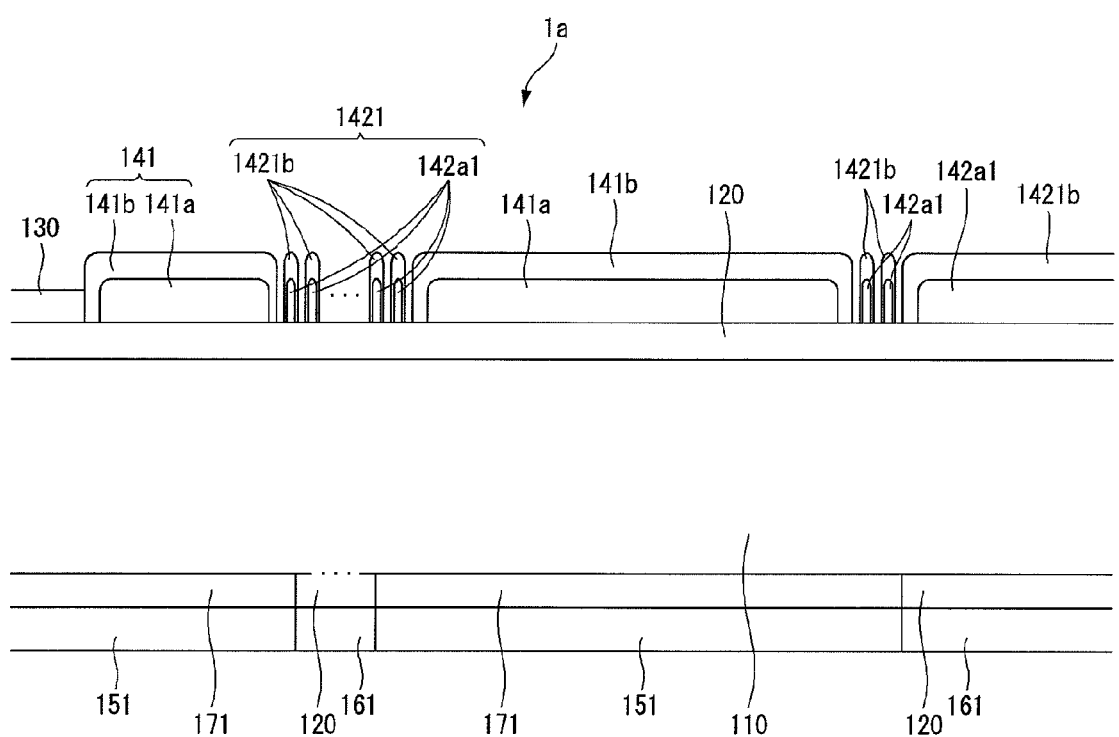
FIG. 6 is a cross-sectional view taken along line VI-VI of FIG. 5.

FIG. 5 is a partial perspective view of a solar cell according to another embodiment of the invention. FIG. 6 is a cross-sectional view taken along line VI-VI of FIG. 5.

The solar cell 1a according to the embodiment of the invention has substantially the same structure as the solar cell 1 illustrated in FIGS. 1 and 2.

More specifically, the solar cell 1a includes a substrate 110, an emitter layer 120 positioned in the substrate 110, an anti-reflection layer 130 positioned on the emitter layer 120 of a front surface of the substrate 110, a front electrode part 140a positioned on the emitter layer 120 of the front surface of the substrate 110, a back electrode 151 positioned on a back surface of the substrate 110, a back electrode current collector 161 electrically connected to the back electrode 151, and a back surface field layer 171 positioned between the substrate 110 and the back electrode 151.

The front electrode part 140a includes a plurality of front electrodes 141 and a plurality of front electrode current collectors 1421. In the same manner as the solar cell 1, each of the front electrode current collectors 1421 includes a first current collector layer 142a having a plurality of first portions 142a1 and a plurality of second portions 142a2 and a second current collector layer 1421b.

In the solar cell 1 shown in FIGS. 1 and 2, the second current collector layer 142b is positioned even between the first portions 142a1 of the first current collector layer 142a. On the other hand, in the solar cell 1a shown in FIGS. 5 and 6, the second current collector layer 1421b is formed along the first and second portions 142a1 and 142a2 of the first current collector layer 142a. Hence, the front electrode current collector 1421 has a portion where the second current collector layer 1421b is not formed and exposes a portion of the anti-reflection layer 130.

As described above, in the solar cell 1a, because a difference between the heights of the front electrode 141 and the current collector 1421 decreases, a defective amount of the solar cell 1a decreases, the conductivity of carriers is improved, and the manufacturing cost is reduced. Further, an incident area of light increases, and thus the efficiency of the solar cell la is improved.

Since a method for manufacturing the solar cell 1a is substantially the same as the method for manufacturing the solar cell 1 illustrated in FIGS. 4A to 4F except a process for forming the second current collector layer 1421b, a further description thereof is not made.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell, comprising:
    a first conductive type substrate;
    an emitter layer of a second conductive type opposite the first conductive type, the emitter layer and the substrate forming a p-n junction, the emitter layer being positioned on a first surface of the substrate;
    a plurality of first electrodes electrically connected to the emitter layer;
    at least one current collector connected to the plurality of first electrodes; and
    a second electrode electrically connected to the substrate, the second electrode being positioned on a second surface of the substrate opposite the first surface of the substrate,
    wherein each of the plurality of first electrodes comprises a first electrode layer and a second electrode layer positioned on an upper part and lateral surfaces of the first electrode layer,
    each of the at least one current collector comprises a first current collector layer and at least one second current collector layer positioned on the first current collector layer,
    the first current collector layer includes a plurality of first portions and the at least one second current collector layer is positioned on the plurality of first portions,
    the at least one second current collector layer is positioned between adjacent ones of the plurality of first portions, on upper parts of the plurality of first portions, and on lateral surfaces of the plurality of first portions positioned at edges of the at least one first current collector layer, and
    the plurality of first portions are positioned to be spaced apart from each other within the at least one second current collector layer.

2. The solar cell of claim 1, wherein a width ratio of each of the plurality of first electrodes to the at least one current collector is approximately 1:200 to 1:370.

3. The solar cell of claim 1, wherein a width of the first electrode layer is approximately 50% to 150% of a width of the second electrode layer excluding the first electrode layer from the first electrode.

4. The solar cell of claim 1, wherein the first electrode layer has a width of approximately 30 μm to 80 μm.

5. The solar cell of claim 4, wherein the first electrode layer and the first portion each have a height of approximately 7 μm to 10 μm.

6. The solar cell of claim 1, wherein each of the plurality of the first portions has a width of approximately 30 μm to 200 μm.

7. The solar cell of claim 6, wherein the first electrode layer and the first portion each have a height of approximately 7 μm to 10 μm.

8. The solar cell of claim 1, wherein the plurality of first portions extend in a direction crossing the plurality of first electrode layers.

9. The solar cell of claim 8, wherein the plurality of first portions extend substantially parallel to one another.

10. The solar cell of claim 8, wherein the plurality of first portions are positioned on the same level layer as the plurality of first electrode layers.

11. The solar cell of claim 1, wherein a distance between two adjacent ones of the plurality of first portions is approximately 20 μm to 100 μm.

12. The solar cell of claim 1, wherein the at least one second current collector layer is positioned on upper parts and lateral surfaces of the plurality of first portions.

13. The solar cell of claim 1, wherein the at least one first current collector layer further comprises at least one second portion for connecting the plurality of first portions to one another.

14. The solar cell of claim 13, wherein the at least one second portion extends in a direction crossing the plurality of first portions.

15. The solar cell of claim 14, wherein the at least one second portion is positioned on the same level layer as the plurality of first portions.

16. The solar cell of claim 15, wherein the plurality of first portions are positioned on the same level layer as the first electrode layers.

17. The solar cell of claim 13, wherein the at least one second current collector layer is positioned between adjacent ones of the plurality of first portions, on upper parts of the plurality of first portions, on an upper part of the at least one second portion, on lateral surfaces of the plurality of first portions positioned at edges of the at least one first current collector layer, and on a lateral surface of the at least one second portion.

18. The solar cell of claim 13, wherein the at least one second current collector layer is positioned on upper parts of the plurality of first portions, an upper part of the at least one second portion, lateral surfaces of the plurality of first portions, and a lateral surface of the at least one second portion.

19. The solar cell of claim 1, wherein the second electrode layer is connected to the at least one second current collector layer.

20. The solar cell of claim 1, wherein the first electrode layer and the first current collector layer are formed of the same material, and the second electrode layer and the second current collector layer are formed of the same material.

21. The solar cell of claim 1, wherein the first current collector layer and the at least one second current collector layer directly contacts the emitter layer.

* * * * *